(12) United States Patent
Meng

(10) Patent No.: US 9,270,041 B2
(45) Date of Patent: *Feb. 23, 2016

(54) STACKED CONNECTOR COMPONENT IN WHICH HIGH-SPEED SIGNAL PINS ARE ROUTED TO DIFFERENT SIDE THAN LOW-SPEED SIGNAL PINS, AND CIRCUIT BOARD THEREFOR

(71) Applicant: LENOVO ENTERPRISE SOLUTIONS (SINGAPORE) PTE. LTD., New Tech Park (SG)

(72) Inventor: Jian Meng, Kanata (CA)

(73) Assignee: Lenovo Enterprise Solutions (Singapore) PTE. LTD, New Tech Park (SG)

( * ) Notice: Subject to any disclaimer, the term of this patent is extended or adjusted under 35 U.S.C. 154(b) by 0 days.

This patent is subject to a terminal disclaimer.

(21) Appl. No.: 14/334,457

(22) Filed: Jul. 17, 2014

(65) Prior Publication Data

US 2014/0329393 A1 Nov. 6, 2014

Related U.S. Application Data

(63) Continuation of application No. 13/745,835, filed on Jan. 20, 2013, now Pat. No. 8,864,518.

(51) Int. Cl.
*H01R 13/66* (2006.01)
*H01R 12/71* (2011.01)
(Continued)

(52) U.S. Cl.
CPC ............... *H01R 12/712* (2013.01); *G02B 6/42* (2013.01); *H01R 13/46* (2013.01); *H01R 13/648* (2013.01); *H05K 1/0213* (2013.01); *H05K 1/0298* (2013.01); *H05K 1/116* (2013.01); *H01R 13/6466* (2013.01); *H01R 2201/04* (2013.01); *H05K 2201/09227* (2013.01); *H05K 2201/10189* (2013.01)

(58) Field of Classification Search
CPC ........................................................ H01R 13/64
USPC ......... 439/701, 504.1, 541.5, 78, 79, 80, 676, 439/607.11
See application file for complete search history.

(56) References Cited

U.S. PATENT DOCUMENTS 5,733,143 A 3/1998 Ward
6,161,283 A 12/2000 Tokuwa
(Continued)

OTHER PUBLICATIONS

J. Gonzalez et al., "SI Routing Guidelines for QSFP+ Stacked Connectors", Molex document No. AS-76870-0002, Dec. 7, 2011.
(Continued)

Primary Examiner — Phuongchi T Nguyen
(74) Attorney, Agent, or Firm — Katherine Brown

(57) ABSTRACT

A stacked connector component includes a housing, connectors at a front opening of the housing and arranged in a stacked formation within one or more columns, and a for and exposed at the connectors. The pins include high-speed pins routed within the housing to a bottom side thereof and low-speed pins routed within the housing to a back side or a top side thereof. A circuit board includes pin pads connectable to the pins and disposed on a substrate. The pin pads include high-speed signal pin pads for the high-speed signal pins. The substrate includes contiguous high-speed areas in which the high-speed signal pin pads for the high-speed pins are located, between which no pin pads are located.

17 Claims, 6 Drawing Sheets

(51) Int. Cl.
*H05K 1/02* (2006.01)
*G02B 6/42* (2006.01)
*H01R 13/46* (2006.01)
*H01R 13/648* (2006.01)
*H05K 1/11* (2006.01)
*H01R 13/6466* (2011.01)

(56) References Cited

U.S. PATENT DOCUMENTS

| | | |
|---|---|---|
| 6,371,780 B1 | 4/2002 | Aponte |
| 6,729,891 B2 * | 5/2004 | Egan et al. ............. 439/79 |
| 6,739,910 B1 | 5/2004 | Wu |
| 7,300,317 B2 | 11/2007 | Dillon |
| 7,360,954 B1 | 4/2008 | Seaver |
| 7,934,124 B2 | 4/2011 | Bechtolsheim |
| 7,934,959 B2 | 5/2011 | Rephaeli |
| 7,979,983 B2 | 7/2011 | Bird |
| 2002/0192988 A1 | 12/2002 | Droesbeke |
| 2009/0124120 A1 | 5/2009 | Wang |
| 2011/0125312 A1 | 5/2011 | D'Andrea |
| 2011/0255574 A1 | 10/2011 | Carter |
| 2011/0268443 A1 | 11/2011 | Adler |
| 2011/0274400 A1 | 11/2011 | Mudd |
| 2011/0306238 A1 * | 12/2011 | Yu et al. ............. 439/607.01 |
| 2012/0009823 A1 * | 1/2012 | Lapidot et al. ............. 439/626 |
| 2012/0087675 A1 | 4/2012 | Peng |
| 2012/0161893 A1 | 6/2012 | Ye |
| 2014/0206207 A1 * | 7/2014 | Ming ............. 439/78 |

OTHER PUBLICATIONS

N. Tang et al., "Quad Small Form-Factor Pluggable Module Pull-To-Release Retractable Lever Latch Mechanism", IP.com IPCOM000213142D, Dec. 5, 2011.

* cited by examiner

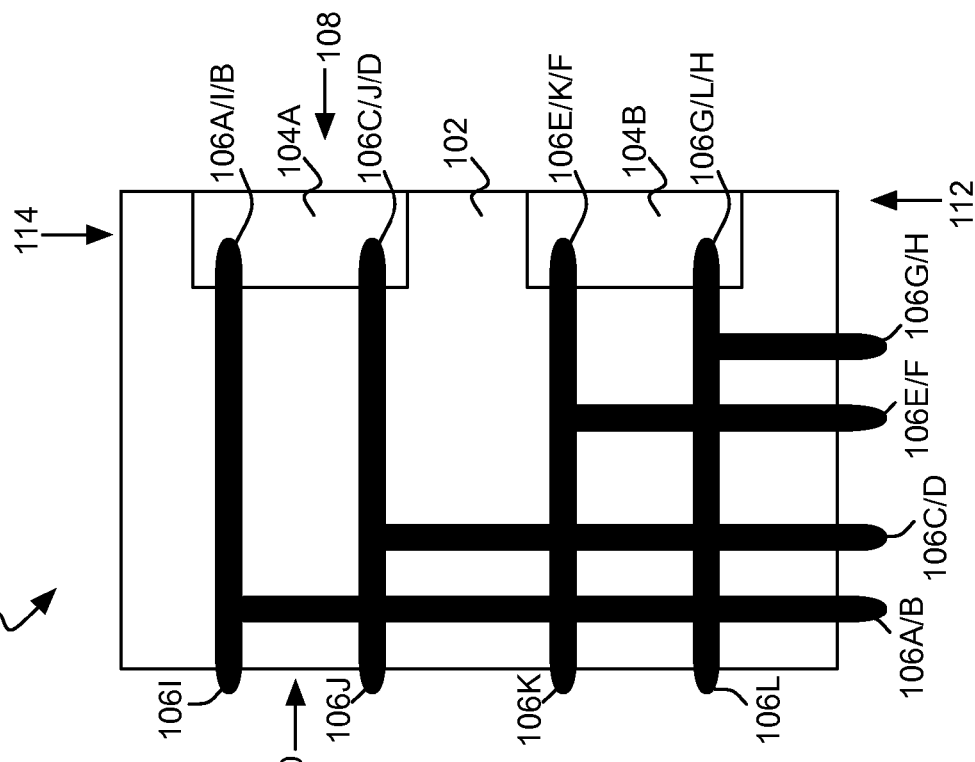
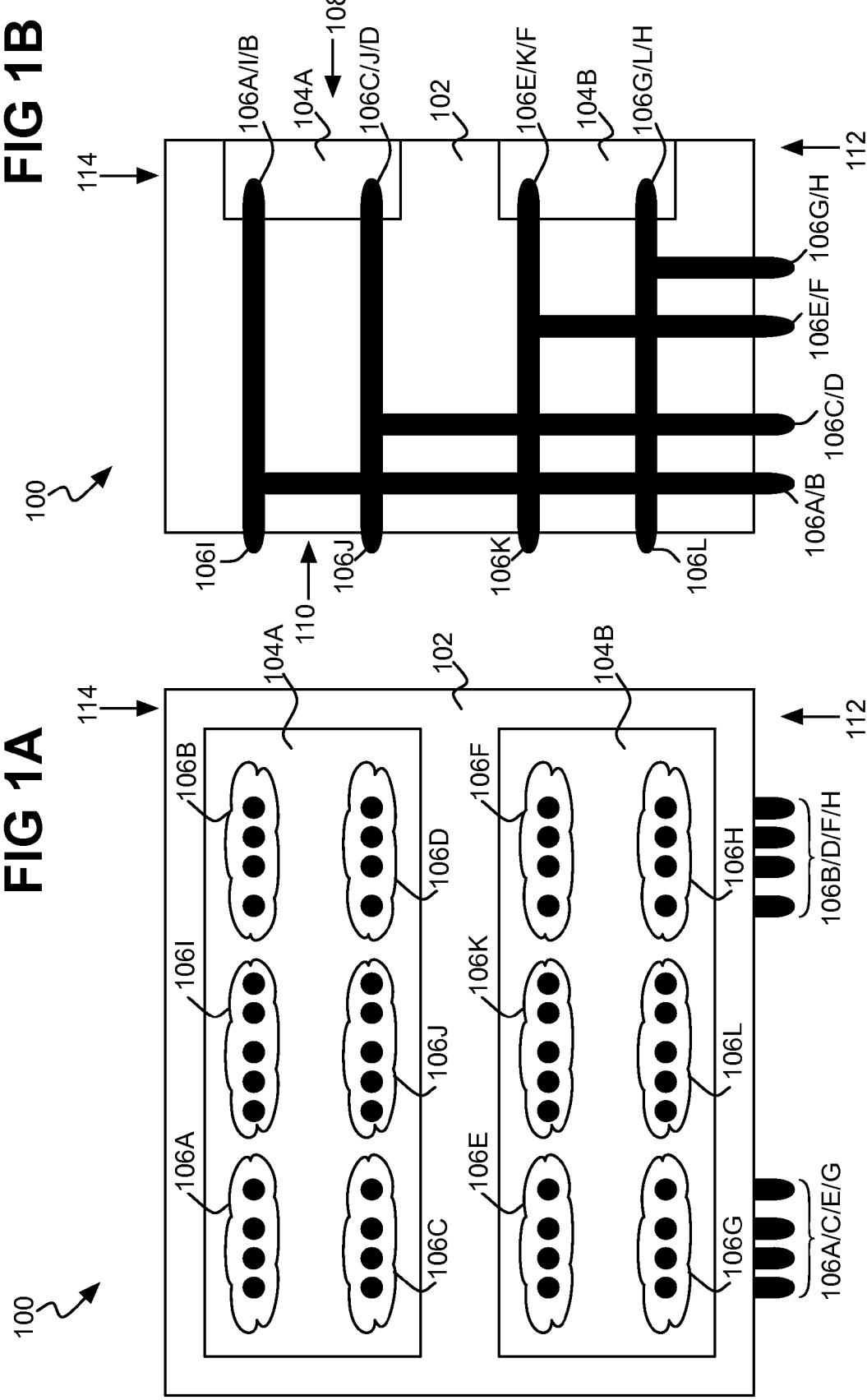

STACKED CONNECTOR COMPONENT IN WHICH HIGH-SPEED SIGNAL PINS ARE ROUTED TO DIFFERENT SIDE THAN LOW-SPEED SIGNAL PINS, AND CIRCUIT BOARD THEREFOR

RELATED APPLICATIONS

The present patent application is a continuation of the previously filed and currently pending patent application assigned Ser. No. 13/745,835, filed on Jan. 20, 2013.

BACKGROUND

Different electronic devices, such as computing devices and networking devices, are commonly interconnected via cables. A cable having connectors at its ends is thus plugged into corresponding connectors of the devices to be interconnected. For example, a computing device like a desktop or a laptop computer may be interconnected with a networking device like a router in this manner.

SUMMARY

An example stacked connector component of the disclosure includes a housing having a bottom side, a top side opposite the bottom side, a back side perpendicular to the bottom side and the top side, and a front opening opposite the back side and perpendicular to the bottom side and the top side. The stacked connector component includes connectors at the front opening and arranged in a stacked formation within one or more columns. The stacked connector component includes pins for and exposed at the connectors, including high-speed signal pins and low-speed signal pins. The high-speed signal pins are to carry signals at a data rate greater than a data rate of signals that the low-speed signal pins are to carry. The high-speed signal pins are routed within the housing to the bottom side to connect to a circuit board, and the low-speed signal pins are routed within the housing to the back side or the top side to connect to the circuit board.

An example circuit board of the disclosure includes pin pads for and to conductively connect to pins of a stacked connector component having connectors over which the pins are organized. The pin pads include high-speed signal pin pads for and corresponding to high-speed signal pins. The pins also include low-speed signal pins. The circuit board includes a substrate on which the pin pads are disposed. The substrate has contiguous high-speed areas in which the high-speed signal pin pads for the high-speed pins are located. None of the pin pads are located between the contiguous high-speed areas. The high-speed signal pins are to carry signals at a data rate greater than a data rate of signals that the low-speed signal pins are to carry.

An example electronic device of the electronic device includes a stacked connector component. The stacked connector component includes a housing, connectors at a front opening of the housing and arranged in a stacked formation within one or more columns, and pins for and exposed at the connectors. The pins include high-speed pins routed within the housing to a bottom side of the housing and low-speed pins routed within the housing to a back side of the housing. The electronic device includes an internal connector attached to the back side of the housing of the stacked connector. The internal connector routes the low-speed pins downwards. The electronic device includes a circuit board having a substrate on which the stacked connector component and the internal connector are attached. The circuit board has pin pads disposed on the substrate and conductively connected to the pins. The pins are organized over the connectors. The pin pads include high-speed signal pin pads for the high-speed signal pins. The substrate has contiguous high-speed areas in which the high-speed signal pin pads for the high-speed pins are located and between which none of the pin pads are located. The high-speed signal pins are to carry signals at a data rate greater than a data rate of signals that the low-speed signal pins are to carry.

BRIEF DESCRIPTION OF THE SEVERAL VIEWS OF THE DRAWINGS

The drawings referenced herein form a part of the specification. Features shown in the drawing illustrate only some embodiments of the disclosure, and not of all embodiments of the disclosure, unless the detailed description explicitly indicates otherwise, and readers of the specification should not make implications to the contrary.

FIGS. 1A and 1B are diagrams of a front view and a cross-sectional side profile, respectively, of an example stacked connector component.

DETAILED DESCRIPTION

Figure 2:
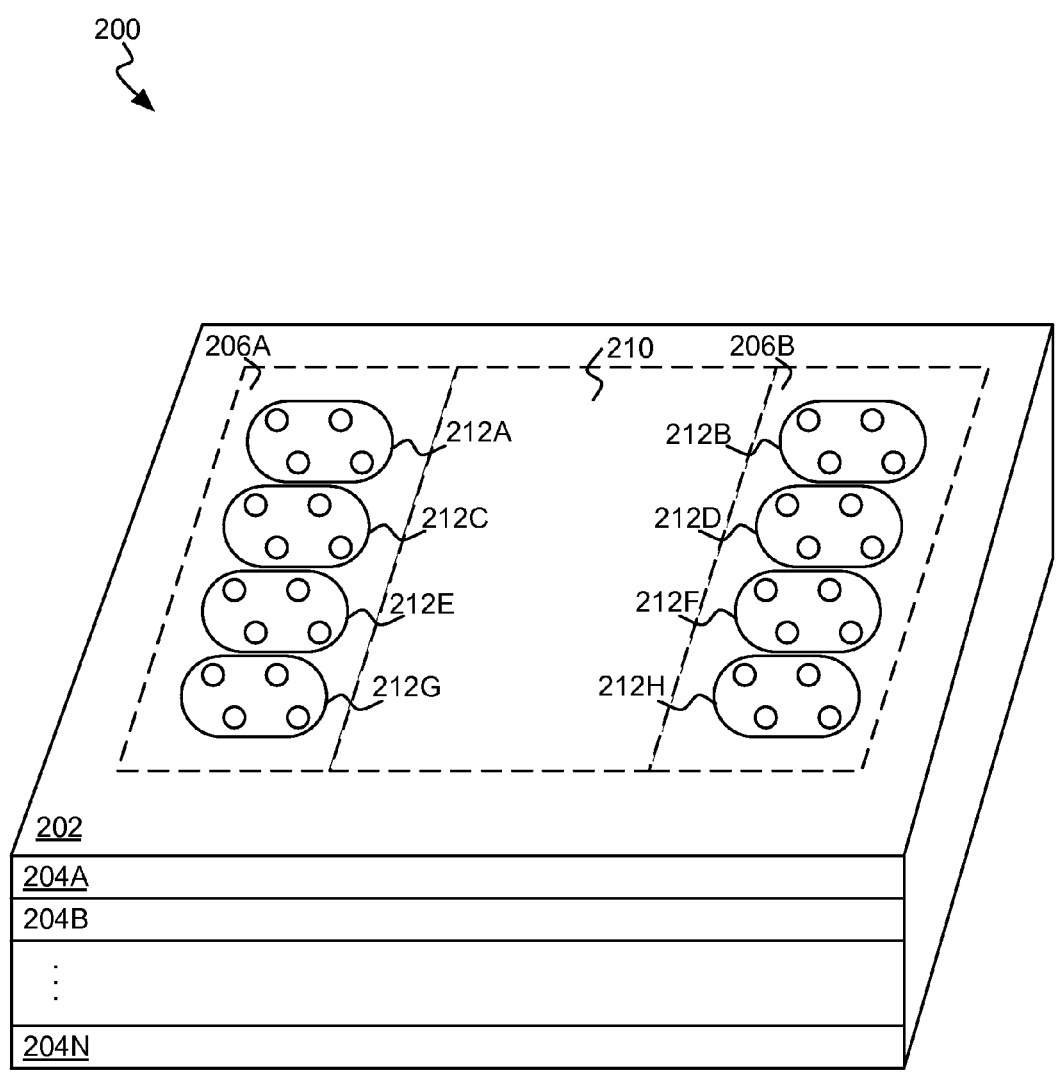
FIG. 2 is a diagram of a perspective view of an example circuit board.

The following detailed description of exemplary embodiments of the disclosure refers to the accompanying drawings that form a part of the description. The drawings illustrate specific exemplary embodiments in which the disclosure may be practiced. The detailed description, including the drawings, describes these embodiments in sufficient detail to enable those skilled in the art to practice the disclosure. Those skilled in the art may further utilize other embodiments of the disclosure, and make logical, mechanical, and other changes without departing from the spirit or scope of the disclosure. Readers of the following detailed description should, therefore, not interpret the description in a limiting sense, and only the appended claims define the scope of the embodiment of the disclosure.

As noted in the background section, electronic devices are commonly interconnected to one another via cables that connect to connectors of the electronic devices. For high-speed networking applications, one type of connector is a quad small form-factor pluggable (QSFP/QSFP+/zQSFP+) connector. Furthermore, multiple QSFP/QSFP+/zQSFP+ can be stacked within a single stacked connector component, such as in a two connectors high-by-one connector wide grid or in a two connectors high-by-three connectors wide grid. This permits a given electronic device to be connected to multiple other devices, and/or to provide greater bandwidth to one or more such devices.

A multi-source agreement (MSA) governs the standard for the pins of a QSFP/QSFP+/zQSFP+ connector. This standard specifies that low-speed signal pins, including power pins and some ground pins, are located within the center of the connector, and that high-speed signal pins and other ground pins are located to either side of the low-speed signal pins within the connector. For electronic devices to adhere to the MSA, therefore, their connectors have to satisfy this standard.

A stacked connector component having multiple connectors is mounted on a circuit board, like a printed circuit board, of an electronic device, so that the device can communicate with other electronic device(s) connected to the connectors of the component. Generally the pins are routed through a housing of the stacked connector component, such as an electromagnetic interference (EMI) cage, from the connectors to the bottom of the housing. The pins are electrically connected to corresponding pin pads of the circuit board, and conductive traces connect the pin pads to electronic components on the circuit board.

Unfortunately, the MSA-specified standard for the pin configuration of QSFP/QSFP+/zQSFP+ connectors is problematic for such stacked connector components, both for the components themselves and for the circuit boards on which they are mounted. Because all the pins are routed to the bottom of a stacked connector component's housing, the resulting large gaps through this housing can permit greater EMI leakage to occur. It is difficult to route the conductive traces for the high-speed pins on the circuit board receptive to such a stacked connector component, because the low-speed pins that are between the high-speed pins have to have their conductive traces routed among the conductive traces for the high-speed pins. This can increase crosstalk among the high-speed conductive traces, since they may have to be placed close together. To achieve minimum performance levels, circuit boards having greater number of layers may thus be required, which can increase manufacturing cost.

Disclosed herein are techniques that ameliorate these and other problems. Low-speed signal pins can be routed to the back side of a stacked connector component's housing, and high-speed signal pins routed to the bottom of the housing. The gap at the bottom of the housing can thus be reduced in size, which reduces EMI leakage. Another connector may be attached to the stacked connector component to route the low-speed signal pins downwards so that they can be connected to the same surface on a circuit board as the low-speed signal pins.

Such separation of the high-speed pins from the low-speed pins within the stacked connector component means that they are mounted to different contiguous areas on the circuit board. This makes for easier routing of conductive traces on the circuit board, and permits the high-speed conductive traces to be placed apart from one another, which decreases crosstalk. A lesser number of layers is typically needed to achieve a given performance level as well. As such, manufacturing costs are reduced.

FIGS. 1A and 1B show a front view and a side profile, respectively, of an example stacked connector component 100. The stacked connector component 100 includes a housing 102 in which two connectors 104A and 104B, collectively referred to as the connectors 104, are disposed at a front opening 108 of the housing 102. The housing 102 may be an EMI cage. The connectors 104 may be QSFP/QSFP+/zQSFP+ connectors in one implementation.

In the example of FIGS. 1A and 1B, the connectors 104 of the stacked connector component 100 are arranged within the stacked connector component 100 in a stacked formation within one column. That is, the connectors 104 are arranged in a two connector-high stacked formation within a single column, resulting in the connectors 104 thus being arranged in a two connector-by-one connector manner at the front opening 108 of the housing 102. In other implementations, there may be more connectors 104 arranged in different stacked formations. For example, six connectors 104 may be arranged in a two connector-high stacked formation within three columns, resulting in the connectors 104 being arranged in a two connector-by-three connector manner at the front opening 108 of the housing 102.

The stacked connector component 100 includes signal pins 106A, 106B, 106C, 106D, 106E, 106F, 106G, 106H, 106I, 106J, 106K, and 106L, which are collectively referred to as the signal pins 106. The signal pins 106 are for and exposed at the connectors 104. The signal pins 106A/B/C/D/I/J of the connector 104A include high-speed signal pins 106A/B/C/D over two rows, and low-speed signal pins 106O over two rows. The signal pins 106E/F/G/H/K/L of the connector 104B include high-speed signal pins 106E/F/G/H over two rows, and low-speed signal pins 106K/L over two rows. Each group of signal pins 106A/B/C/D/E/F/G/H is representatively depicted in FIG. 1A as including four actual pins, and each group of signal pins 106I/J/K/L is representatively depicted as including five actual pins but there may be more or less pins in each such group of signal pins. Ground pins of the stacked connector component 100 are explicitly not depicted in FIGS. 1A and 1B for illustrative clarity and convenience.

The high-speed signal pins 106A/B/C/D/E/F/G/H carry signals at a data rate greater than a data rate at which the low-speed signal pins 106I/J/K/L carry signals. That is, the high-speed signal pins 106A/B/C/D/E/F/G/H carry high-speed signals at a high data rate, and the low-speed signal pins 106I/J/K/L carry low-speed signals at a low data rate. For instance, the high data rate may be up to ten or twenty-five gigabits-per-second (Gbps), and the low data rate may be no more than ten Gbps or lower, such as 400 kilohertz (kHz). Furthermore, the low-speed signal pins 106I/J/K/L can be said to include other types of pins, such as power pins. Such pins do not route signals per se, but rather provide power, and so on.

The high-speed signal pins A/B/C/D/E/F/G/H are each located at either end of a pair of ends of one of the connectors 104 in the example of FIGS. 1A and 1B. By comparison, the low-speed signal pins 106I/J/K/L are each located within a middle of one of the connectors 104. That is, the high-speed signal pins A/B/C/D are not contiguous to one another within the connector 104A, but rather are divided over the two ends of the connector 104A. Likewise, the high-speed signal pins 106E/F/G/H are not contiguous to one another within the connector 104B, but rather are divided over the two ends of the connector 104B. The low-speed pins 106I/J by comparison are contiguous to one another within the middle or center of the connector 104A, and likewise the low-speed pins 106K/L are contiguous to one another within the middle or center of the connector 104B.

The signal pins 106 each have two ends. One end of each of the signal pins 106 is exposed at one of the connectors 104 at the front opening 108 of the housing 102 of the stacked connector component 100. In the example of FIGS. 1A and 1B, the other end of each of the signal pins 106 is exposed at a back side 110 or at a bottom side 112 of the housing 102. In other implementations, the other end of each of the signal pins 106 may be exposed at the back side 110, at the bottom side 112, or at a top side 114 of the housing 102, as described in more detail later in the detailed description. The back side 110 and the front opening 108 of the housing 102 are opposite one another, as are the top side 114 and the bottom side 112 of the housing 102. The top side 114 and the bottom side 112 of the housing 102 are further perpendicular to the back side 110 and to the front opening 108 of the housing 102.

The low-speed pins 106I/J/K/L are routed within the housing 102 to the back side 110 of the housing 102 of the stacked connector component 100. By comparison, the high-speed pins 106A/B/C/D/E/F/G/H are routed within the housing 102 to the bottom side 112 of the housing 102. This configuration structurally differs from conventional stacked connector components for QSFP/QSFP+/zQSFP+ connectors, in which all pins—including both high-speed and low-speed pins—are routed to the bottom 112 side of the housing. That is, in the example of FIGS. 1A and 1B, just the high-speed pins 106A/B/C/D/E/F/G/H are routed to the bottom side 112 of the housing 102, whereas the low-speed pins 106I/J/K/L are innovatively (re)routed to the back side 110 of the housing 102.

Other implementations can differ from the example of FIGS. 1A and 1B, in which the high-speed pins 106A/B/C/D/E/F/G/H and the low-speed pins 106I/J/K/L are routed to different sides of the housing 102 of the stacked connector component 100. For instance, the low-speed pins 106I/J/K/L may be (re)routed to the top side 114 of the housing 102 instead of to the back side 110 of the housing 102.

FIG. 2 shows an example circuit board 200, like a printed circuit board, which is compatible with the stacked connector component 100. That is, the stacked connector component 100 can be mounted on the circuit board 200. The circuit board 200 includes a substrate 202. The substrate 202 of the circuit board 200 can include a number of stacked layers 204A, 204B, . . . , 204N, collectively referred to as the layers 204. The layers 204 can include signal routing layers, including high-speed signal routing layers, low-speed signal routing layers, power layers (which may be considered as part of the low-speed signal routing layers herein), ground layers, insulating layers, and so on. The layers 204 are depicted in exaggerated size in FIG. 2 for illustrative clarity and convenience.

The substrate 202 includes contiguous areas 206A and 206B, which are collectively referred to as the contiguous areas 206, as well as contiguous areas 208 and 210. Pin pads 212A, 212B, 212C, 212D, 212E, 212F, 212G, and 212H are disposed on the substrate 202 and are collectively referred to as the pin pads 212. Each of the pin pads 212 can include a through hole or via into which a corresponding signal pin of the signal pins 106 of the stacked connector component 100 can be inserted and to which the corresponding signal pin is conductively connected, where the pin pad can include a conductive area surrounding its through hole or via to facilitate this.

The pin pads 212 of the circuit board 200 are high-speed signal pin pads 212A/B/C/D/E/F/G/H that correspond to and are for the high-speed signal pins 106A/B/C/D/E/F/G/H of the stacked connector component 100, respectively. Each group of high-speed signal pin pads 212A/B/C/D/E/F/G/H is representatively depicted in FIG. 2 as including four actual pin pads, but there may be more or less pin pads in each such group of signal pin pads. Low-speed signal pin pads corresponding to the low-speed signal pins 106I/J/K/L are not depicted in FIG. 2 for illustrative clarity and convenience.

The high-speed signal pin pads 212A/C/E/G are located within the contiguous area 206A and the high-speed signal pin pads 212B/D/F/H are located within the contiguous area 206B. Therefore, the contiguous areas 206 are contiguous high-speed areas. None of the pin pads 212, and no other pin pads, are located within the contiguous area 210 of the circuit board 200.

The contiguous area 210 is where low-speed signal pin pads would be located if the corresponding low-speed signal pins 106I/J/K/L of the stacked connector component 100 were not routed to a different side of the housing 102 than the high-speed signal pins 106A/B/C/D/E/F/G/H. That is, contiguous area 210 is where such low-speed signal pin pads would be conventionally located.

Because no pin pads are located within the contiguous area 210, there is extra space between the contiguous high-speed areas 206 in which the high-speed signal pin pads 212A/B/C/D/E/F/G/H are located. This extra space permits for easier routing of conductive traces within the layers 204 of the substrate 202 for connection to the high-speed signal pin pads 212A/B/C/D/E/F/G/H. For instance, such conductive traces may not have to be routed within the contiguous low-speed area 208, since the high-speed signal pin pads 212A/B/C/D/E/F/G/H are located apart from and not with any low-speed signal pin pads. This extra space also can decrease crosstalk, because these conductive traces can be spaced apart. Furthermore, this extra space can permit fewer high-speed signal routing layers to be employed within the circuit board 200, which reduces manufacturing cost.

The circuit board 200 of the example of FIG. 2 is for a two-by-one stacked connector component, like the component 100 of the example of FIG. 1. The circuit board 200 can be easily extended to stacked connector components having more than two connectors 104 as the stacked connector component 100 does, however. For example, for a two-by-three stacked connector component, four additional contiguous high-speed areas 206 would be positioned to the right of the high-speed area 206B and in which additional high-speed signal pin pads 212 for the high-speed pins of the corresponding additional four connectors would be located.

Figure 3A:
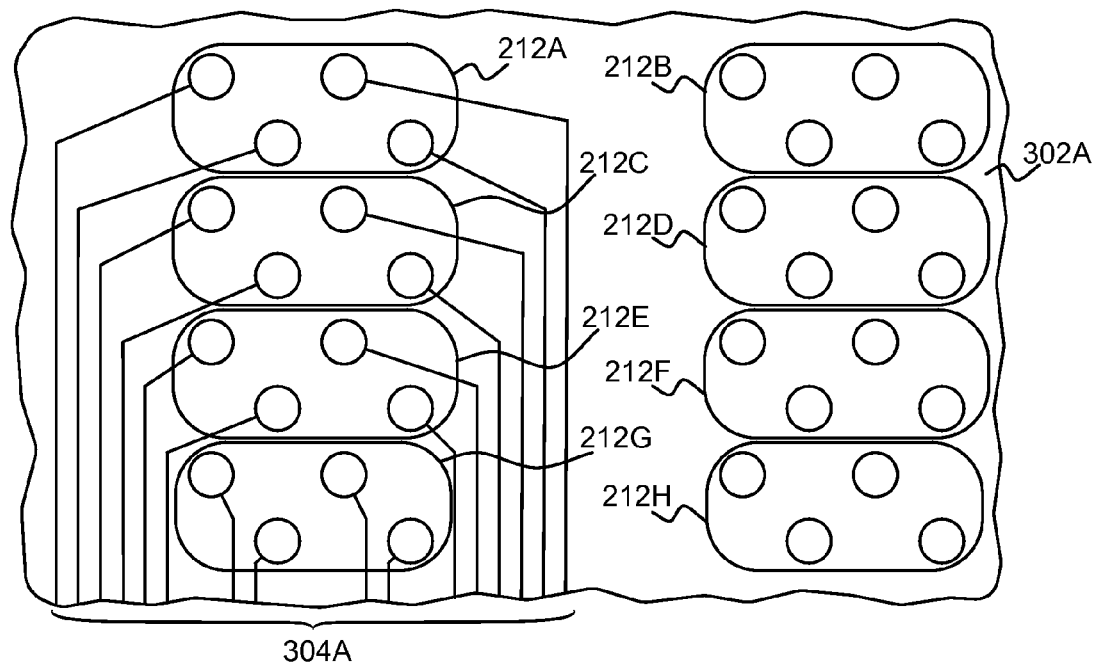
FIGS. 3A and 3B are diagrams of top views of two example high-speed signal routing layers of a circuit board in which there are just two such layers.
Figure 3B:
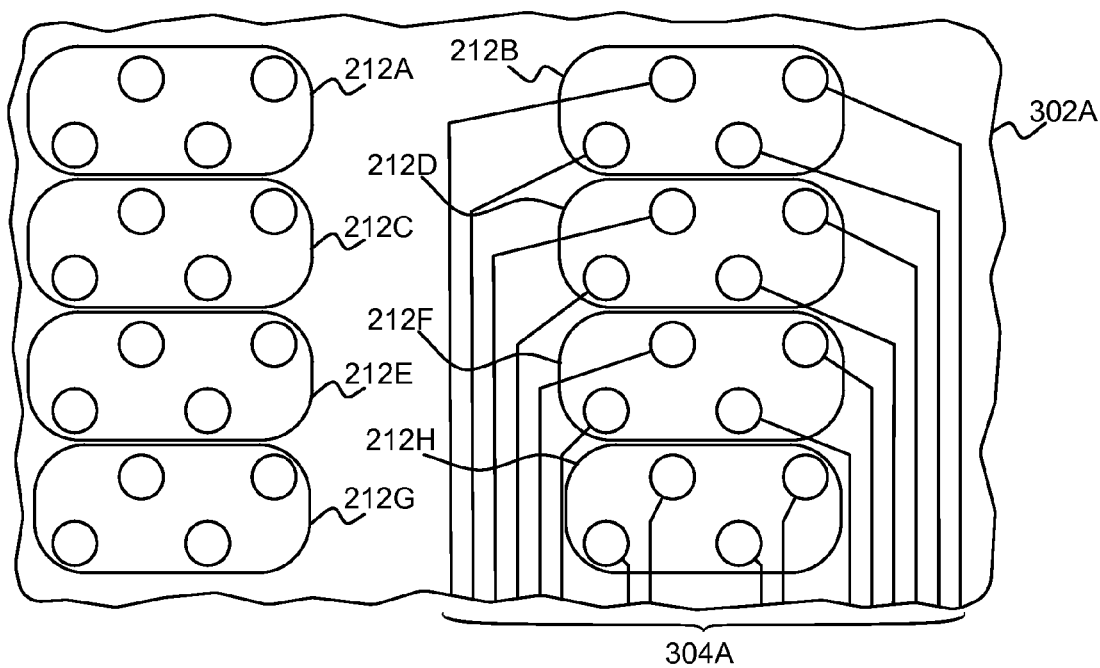

In one implementation, the substrate 202 of the circuit board 200 can include just two high-speed signal routing layers of the stacked layers 204 in which high-speed conductive traces corresponding and connecting to the high-speed signal pads 212A/B/C/D/E/F/G/H are disposed. FIGS. 3A and 3B show example high-speed signal routing layers 302A and 302B for such an implementation. The high-speed signal routing layers 302A and 302B are collectively referred to as the high-speed signal routing layers 302, and are part of the stacked layers 204 of the substrate 202. In this implementation, the high-speed signal routing layers 302 are the only two signal routing layers in which high-speed signals are routed from and to the high-speed signal pins 106A/B/C/D/E/F/G/H of the stacked connector component 100 via the high-speed signal pads 212A/B/C/D/E/F/G/H.

The high-speed signal routing layer 302A includes high-speed conductive traces 304A corresponding and connected to the high-speed signal pads 212A/C/E/G, and the high-speed signal routing layer 302B includes high-speed conductive traces 304B corresponding and connected to the high-speed signal pads 212B/D/F/H. The high-speed conductive traces 304A and 304B are collectively referred to as the high-speed conductive traces 304. The high-speed conductive traces 304A carry signals to and from the high-speed signal pins 106A/C/E/G of the stacked connector component 100 via the high-speed signal pads 212A/C/E/G, and the high-speed conductive traces 304B carry signals to and from the high-speed signal pins 106B/D/F/H via the high-speed signal pads 212B/D/F/H.

FIGS. 3A and 3B illustrate how the extra space of the contiguous area 210 between the high-speed contiguous areas 206 is advantageously employed for routing the high-speed conductive traces 304. Because no low-speed signal pads are disposed between the high-speed signal pads 212A/C/E/G and the high-speed signal pads 212B/D/F/H, the extra space that results can be leveraged for the high-speed conductive traces 304. In FIG. 3A, this extra space is used for the right-most high-speed conductive traces 304A, whereas in FIG. 3B this extra space is used for the left-most high-speed conductive traces 304B.

Figure 4A:
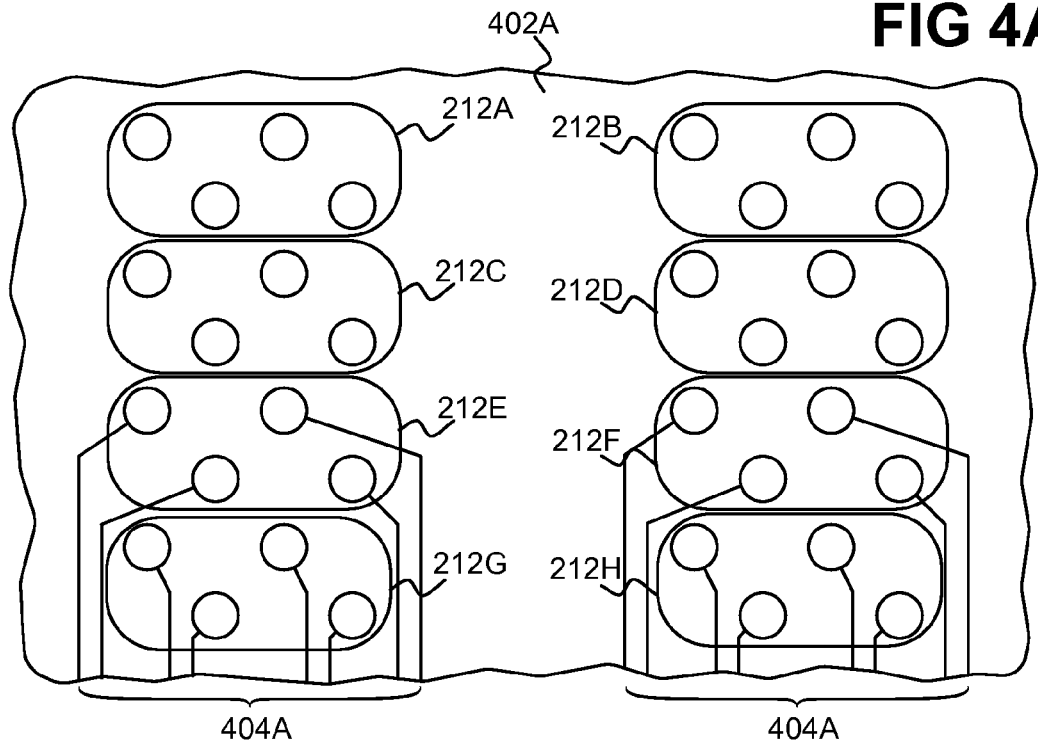
FIGS. 4A, 4B, and 4C are diagrams of top views of three example high-speed signal routing layers of a circuit board in which there are just three such layers.
Figure 4B:
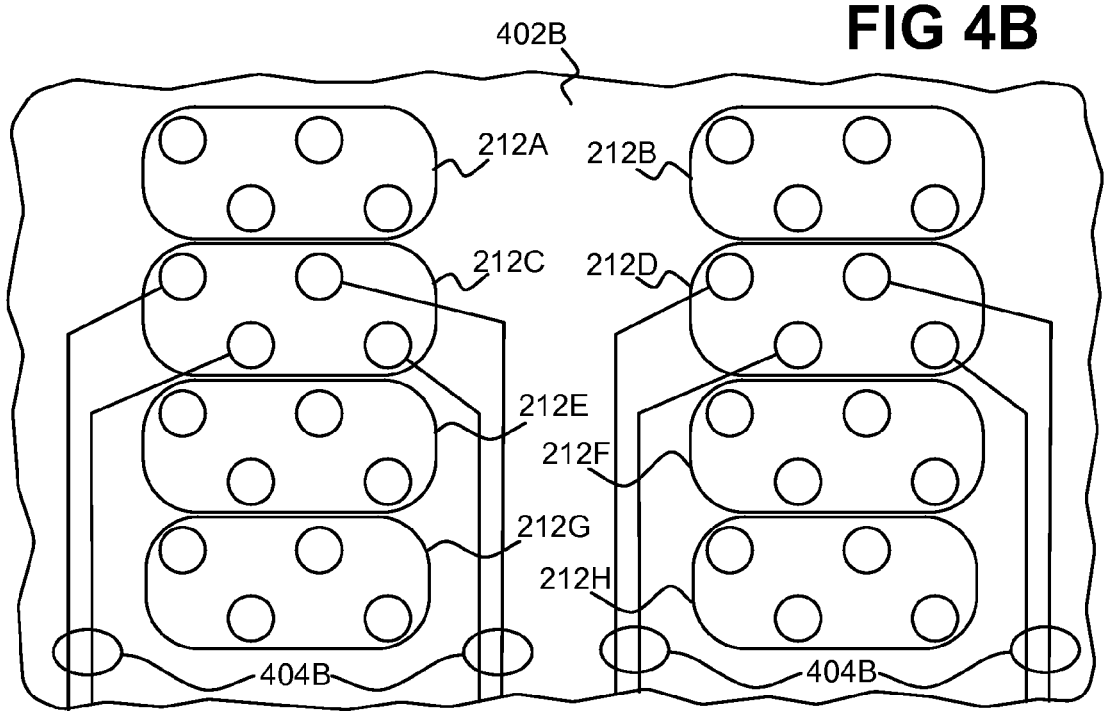
Figure 4C:
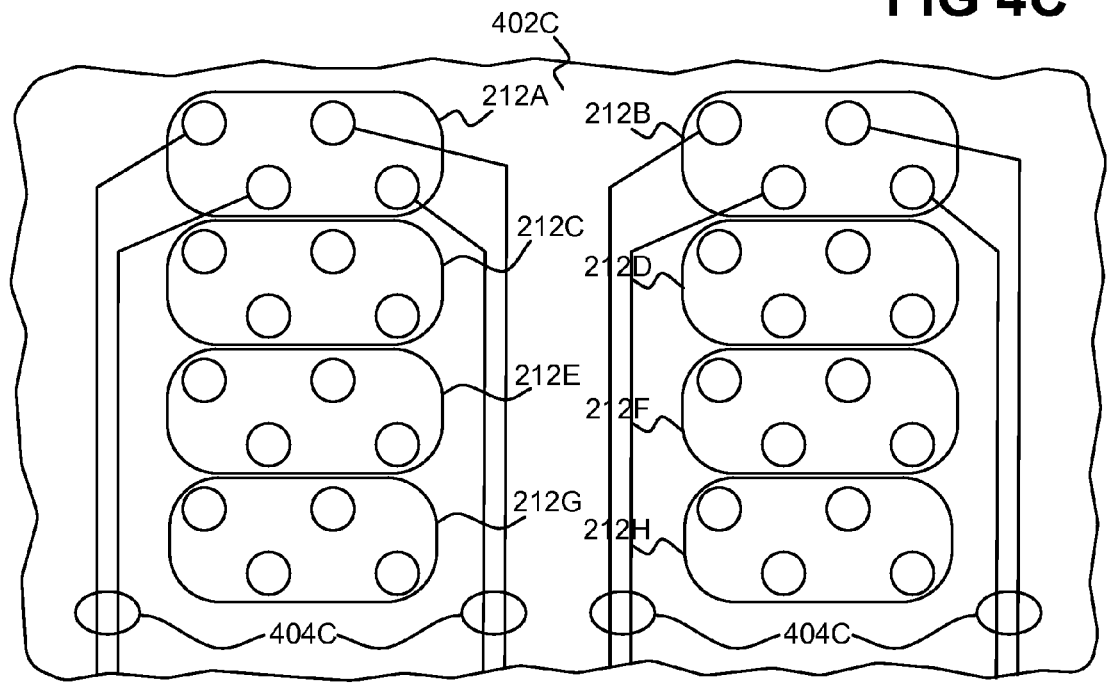

Other implementations can also advantageously leverage the contiguous area 210 between the high-speed contiguous areas 206 for routing high-speed conductive traces. For example, the substrate 202 of the circuit board 200 can include just three high-speed signal routing layers of the stack layers 204 in which high-speed conductive traces corresponding and connecting to the high-speed signal pads 212A/B/C/D/E/F/G/H are disposed. FIGS. 4A, 4B, and 4C show example high-speed signal routing layers 402A, 402B, and 402C for such an implementation. The high-speed signal routing layers 402A, 402B, and 402C are collectively referred to as the high-speed signal routing layers 402, and are part of the stacked layers 204 of the substrate 202. In this implementation, the high-speed signal routing layers 402 are the only three signal routing layers in which high-speed signals are routed from and to the high-speed signal pins 106A/B/C/D/E/F/G/H of the stacked connector component 100 via the high-speed signal pads 212A/B/C/D/E/F/G/H.

The high-speed signal routing layer 402A includes sixteen high-speed conductive traces 404A corresponding and connected to the high-speed signal pads 212E/F/G/H. The high-speed signal routing layer 402B includes eight high-speed conductive traces 404B corresponding and connected to the high-speed signal pads 212C/D. The high-speed signal routing layer 402C includes eight high-speed conductive traces 404C corresponding and connected to the high-speed signal pads 212A/B. The high-speed conductive traces 404A, 404B, and 404C thus carry signals to and from the high-speed signal pins 106A/B/C/D/E/F/G/H via the high-speed signal pads 212A/B/C/D/E/F/G/H.

Figure 5A:
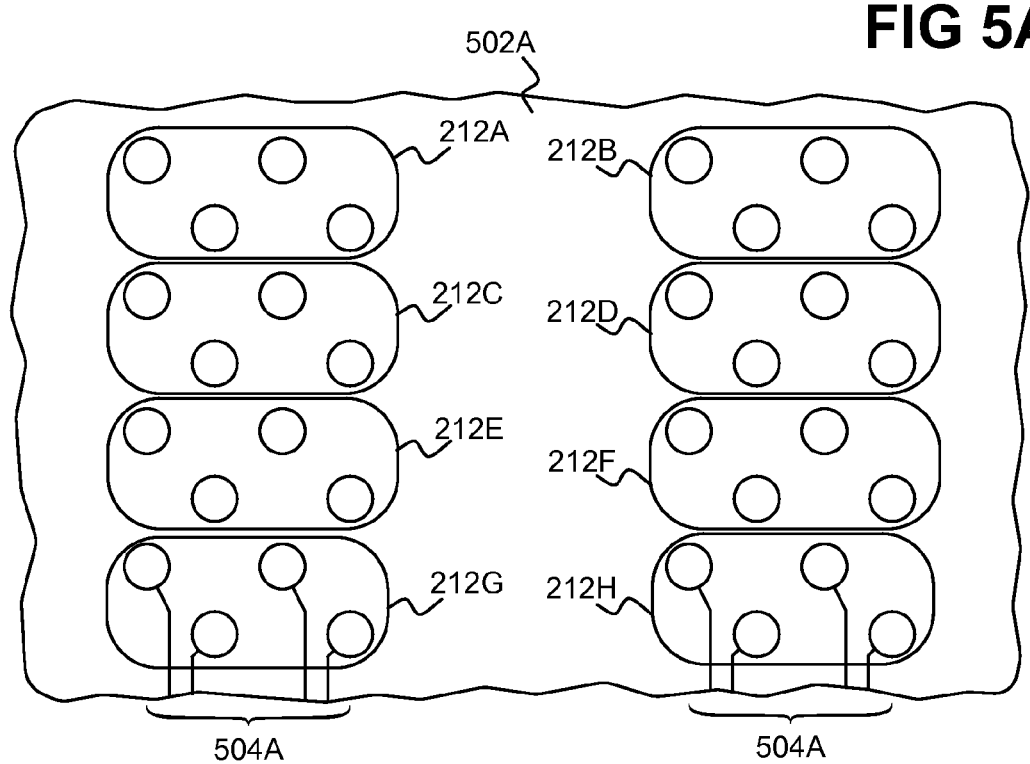
FIGS. 5A and 5B are diagrams of top views of two example high-speed routing layers of a circuit board in which there are just four such layers.
Figure 5B:
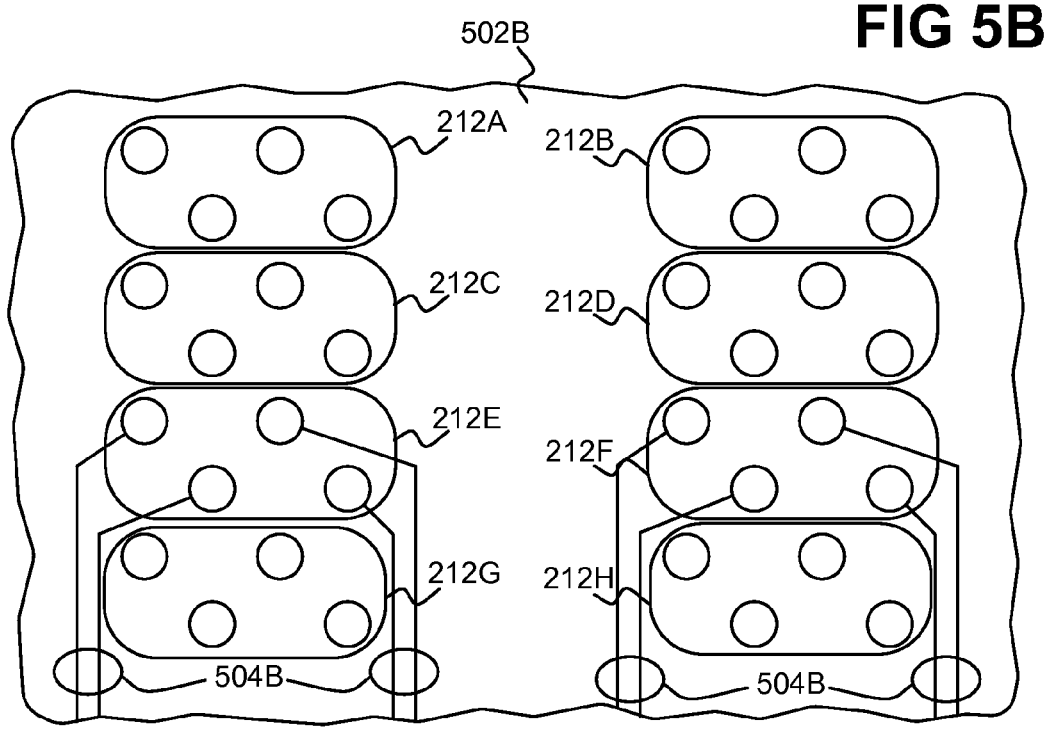

As another example, the substrate 202 of the circuit board 200 can include just four high-speed signal routing layers of the stack layers 204 in which high-speed conductive traces corresponding and connecting to the high-speed signal pads 212A/B/C/D/E/F/G/H are disposed. In such an implementation, the high-speed signal routing layers 402B and 402C are two of these four layers, and FIGS. 5A and 5B show an example of the other two high-speed signal routing layers 502A and 502B for this implementation. The high-speed signal routing layers 502A and 502B are part of the stacked layers 204 of the substrate 202. In this implementation, the high-speed signal routing layers 402B, 402C, 502A, and 502B are the only four signal routing layers in which high-speed signals are routed from and to the high-speed signal pins 106A/B/C/D/E/F/G/H of the stacked connector component 100 via the high-speed signal pads 212A/B/C/D/E/F/G/H.

The high-speed signal routing layer 502A includes eight high-speed conductive traces 504A corresponding and connected to the high-speed signal pads 212G/H. The high-speed signal routing layer 502B includes eight high-speed conductive traces 504B corresponding and connected to eight high-speed signal pads 212E/F. The high-speed signal traces 404B, 404C, 504A, and 504B thus carry signals to and from the high-speed signal pins 106A/B/C/D/E/F/G/H via the high-speed signal pads 212A/B/C/D/E/F/G/H.

Figure 6:
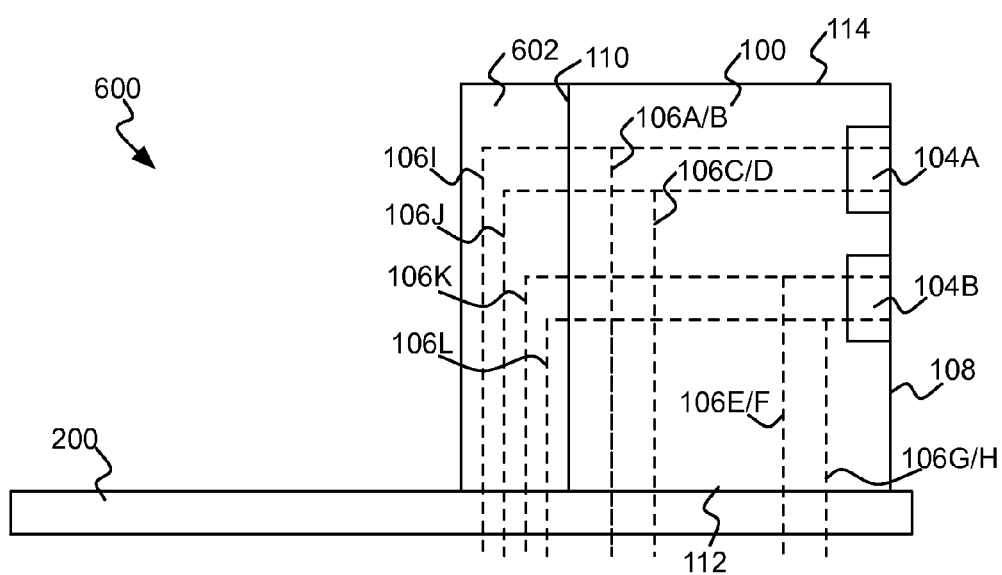
FIG. 6 is a diagram of an example electronic device including a stacked connector component, a circuit board, and an internal connector.

FIG. 6 shows an example electronic device 600. The electronic device 600 can be a computing device, a networking device, and/or another type of electronic device. The electronic device 600 includes the stacked connector component 100, including the connectors 100 and the pins 106, and the circuit board 200. The electronic device 600 also includes an internal connector 602. The internal connector 602 and the stacked connector component 100 are mounted or otherwise attached on or to the circuit board 200 (such as to the substrate thereof).

As has been described, the high-speed signal pins 106A/B/C/D/E/F/G/H extend from the bottom side 112 opposite the top side 114 of the stacked connector component 100. As such, the high-speed signal pins 106A/B/C/D/E/F/G/H extend directly from the stacked connector component 100 to (and through) the circuit board 200, and are electrically connected to the circuit board 200. By comparison, the low-speed signal pins 106I/J/K/L extend from the back side 110 opposite the front opening 108 of the stacked connector component 100. Therefore, they are not readily connectable to the circuit board 200.

The internal connector 602 attaches to the back side 110 of the stacked connector component 100, and extends and routes the low-speed signal pins 106I/J/K/L downwards towards the circuit board 200. As such, the low-speed signal pins 106I/J/K/L extend directly from the internal connector 602—and indirectly from the stacked connector component 100—to (and through) the circuit board 200. The low-speed signal pins 106I/J/K/L are likewise then electrically connected to the circuit board 200.

Although specific embodiments have been illustrated and described herein, it will be appreciated by those of ordinary skill in the art that any arrangement calculated to achieve the same purpose may be substituted for the specific embodiments shown. This application is thus intended to cover any adaptations or variations of embodiments of the present invention. As such and therefore, it is manifestly intended that this invention be limited only by the claims and equivalents thereof.

I claim:

1. A stacked connector component comprising:
 a housing having a bottom side, a top side opposite the bottom side, a back side perpendicular to the bottom side and the top side, and a front opening opposite the back side and perpendicular to the bottom side and the top side;
 a plurality of connectors at the front opening and arranged in a stacked formation within one or more columns; and
 a plurality of pins for and exposed at the connectors, including a plurality of high-speed signal pins and a plurality of low-speed signal pins, the high-speed signal pins to carry signals at a data rate greater than a data rate of signals that the low-speed signal pins are to carry,
 wherein the high-speed signal pins are routed within the housing to the bottom side to connect to a circuit board, and the low-speed signal pins are routed within the housing to the back side or to the top side to connect to the circuit board,
 and wherein each connector is a type of quad small form-factor pluggable (QSFP/QSFP+/zQSFP+) connector.

2. The stacked connector component of claim 1, wherein the housing is an electromagnetic interface (EMI) cage.

3. The stacked connector component of claim 1, wherein the stacked formation in which the connectors are arranged is a two connector-high stacked formation, and the one or more columns within which the connectors are arranged in the two connector-high stacked formation consist of a single column, resulting in the connectors being arranged in a two connector-by-one connector manner at the front opening.

4. The stacked connector component of claim 1, wherein the stacked formation in which the connectors are arranged is a two connector-high stacked formation, and the one or more columns within which the connectors are arranged in the two connector-high stacked formation consist of three columns, resulting in the connectors being arranged in a two connector-by-three connector manner at the front opening.

5. The stacked connector component of claim 1, wherein the low-speed signal pins further include a plurality of power pins.

6. The stacked connector component of claim 1, wherein the high-speed signal pins are routed within the housing to the bottom side to connect to the circuit board, and the low-speed signal pins are routed within the housing to the back side to connect to the circuit board.

7. The stacked connector component of claim 1, wherein each pin has a first end and a second end, the first end exposed at one of the connectors at the front opening of the housing, the second end exposed at the bottom side, the top side, or the back side of the housing to connect to the circuit board.

8. A circuit board comprising:
a stacked connector component having a plurality of pins and a plurality of connectors over which the pins are organized;
a substrate; and
a plurality of pin pads disposed on the substrate and conductively connected to the pins of the stacked connector component, the pin pads including a plurality of high-speed signal pin pads for and corresponding to a plurality of high-speed signal pins of the pins, the pins also including a plurality of low-speed signal pins;
wherein the substrate has a plurality of contiguous high-speed areas in which the high-speed signal pin pads for the high-speed pins are located, where none of the pin pads are located between the contiguous high-speed areas,
wherein the high-speed signal pins are to carry signals at a data rate greater than a data rate of signals that the low-speed signal pins are to carry, and
wherein for each connector as a given connector, the high-speed signal pins for the given connector are located at a pair of ends of the given connector and the low-speed signal pins for the given connector are located within a middle of the given connector between the pair of ends; and
wherein each connector is a type of quad small form-factor pluggable (QSFP/QSFP+/zQSFP+) connector.

9. The circuit board of claim 8, wherein the low-speed signal pin pads further include a plurality of power pin pads corresponding to a plurality of power pins of the pins.

10. The circuit board of claim 8, further comprising a plurality of conductive traces on or within the substrate corresponding to and conductively connected to the pin pads and to route the signals within the circuit board from the pins of the stacked connector component to which the pin pads are conductively connected, the conductive traces including a plurality of high-speed conductive traces corresponding to the high-speed signal pin pads,
the conductive traces each ending at one of the pin pads.

11. The circuit board of claim 10, wherein at least some of the high-speed conductive traces are routed within the substrate between the contiguous high-speed areas.

12. The circuit board of claim 10, wherein the substrate consists of two high-speed signal routing layers, each high-speed conductive trace disposed within one of the two high-speed signal routing layers.

13. The circuit board of claim 10, wherein the substrate consists of four high-speed signal routing layers, each high-speed conductive trace disposed within one of the four high-speed signal routing layers.

14. The circuit board of claim 10, wherein the substrate consists of three high-speed signal routing layers, each high-speed conductive trace disposed within one of the three high-speed signal routing layers.

15. An electronic device comprising:
a stacked connector component comprising a housing, a plurality of connectors at a front opening of the housing and arranged in a stacked formation within one or more columns, and a plurality of pins for and exposed at the connectors, the pins including a plurality of high-speed pins routed within the housing to a bottom side of the housing and a plurality of low-speed pins routed within the housing to a back side of the housing;
an internal connector attached to the back side of the housing of the stacked connector, the internal connector routing the low-speed pins downwards; and
a circuit board having a substrate on which the stacked connector component and the internal connector are attached, the circuit board having a plurality of pin pads disposed on the substrate and conductively connected to the pins, the pins organized over the connectors, the pin pads including a plurality of high-speed signal pin pads,
wherein the substrate has a plurality of contiguous high-speed areas in which the high-speed signal pin pads for the high-speed pins are located, where none of the pin pads are located between the contiguous high-speed areas,
wherein the high-speed signal pins are to carry signals at a data rate greater than a data rate of signals that the low-speed signal pins are to carry,
wherein each connector is a type of quad small form-factor pluggable (QSFP/QSFP+/zQSFP+) connector,
and wherein for each connector as a given connector, the low-speed signal pins for the given connector are located within a middle of the given connector between the pair of ends.

16. The electronic device of claim 15, wherein the substrate further has a plurality of conductive traces corresponding to and conductively connected to the pin pads and to route the signals within the circuit board from the pins of the stacked connector component to which the pin pads are conductively connected, the conductive traces including a plurality of high-speed conductive traces corresponding to the high-speed signal pin pads.

17. The electronic device of claim 15, wherein the low-speed signal pins further include a plurality of power pins.

* * * * *